(12) United States Patent
Nagasato et al.

(10) Patent No.: US 10,559,528 B2
(45) Date of Patent: Feb. 11, 2020

(54) SEMICONDUCTOR DEVICE INCLUDING EXTERNAL TERMINAL GROUPS

(71) Applicant: Rohm Co., Ltd., Kyoto (JP)

(72) Inventors: Masashi Nagasato, Kyoto (JP); Masafumi Okada, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 15/757,389

(22) PCT Filed: Sep. 2, 2016

(86) PCT No.: PCT/JP2016/075851
§ 371 (c)(1),
(2) Date: Mar. 5, 2018

(87) PCT Pub. No.: WO2017/047415
PCT Pub. Date: Mar. 23, 2017

(65) Prior Publication Data
US 2018/0247889 A1    Aug. 30, 2018

(30) Foreign Application Priority Data
Sep. 14, 2015   (JP) ................................. 2015-180864

(51) Int. Cl.
*H01L 23/528*      (2006.01)
*H01L 23/00*       (2006.01)
(Continued)

(52) U.S. Cl.
CPC ............ *H01L 23/528* (2013.01); *H01L 24/06* (2013.01); *H01L 24/14* (2013.01); *H02M 1/08* (2013.01);
(Continued)

(58) Field of Classification Search
CPC ....... H01L 23/528; H01L 24/06; H01L 24/14; H01L 2224/06177; H01L 2224/14177;
(Continued)

(56) References Cited

U.S. PATENT DOCUMENTS

| 5,714,801 A | 3/1998 | Yano et al. | |
| 6,278,264 B1 * | 8/2001 | Burstein | ................ H02M 3/00 323/282 |

(Continued)

FOREIGN PATENT DOCUMENTS

| EP | 1 811 563 A2 | 7/2007 |
| JP | H6-151639 | 5/1994 |

(Continued)

OTHER PUBLICATIONS

Japan Patent Office, International Search Report for PCT/JP2016/075851 dated Nov. 15, 2016 (with English Tmnslation).
(Continued)

*Primary Examiner* — Selim U Ahmed
(74) *Attorney, Agent, or Firm* — Fish & Richardson P.C.

(57) ABSTRACT

This semiconductor device has a plurality of external terminals arranged in an array on a bottom surface of a package. The plurality of external terminals include a first external terminal group for receiving an input of a current from outside the device, and a second external terminal group for outputting a current to the outside of the device. The first external terminal group and the second external terminal group are laid out such that respective arrangement patterns thereof are interlocked with each other. The arrangement patterns may be comb-tooth shaped, cross-shaped, S-shaped, T-shaped, L-shaped, or may have a shape comprising a combination thereof. The plurality of external terminals may be pins, solder balls, or electrode pads.

10 Claims, 10 Drawing Sheets

(51) Int. Cl.
 H02M 1/08 (2006.01)
 H03K 17/687 (2006.01)
 H02P 27/06 (2006.01)
 H04B 1/16 (2006.01)
(52) U.S. Cl.
 CPC .............. *H03K 17/6871* (2013.01); *H01L 2224/06177* (2013.01); *H01L 2224/14177* (2013.01); *H02P 27/06* (2013.01); *H04B 1/16* (2013.01)
(58) Field of Classification Search
 CPC ...... H03K 17/6871; H02M 1/08; H02P 27/06; H04B 1/16
 USPC .................................................. 257/691, 697
 See application file for complete search history.

(56) References Cited

U.S. PATENT DOCUMENTS

| | | |
|---|---|---|
| 6,713,823 B1 | 3/2004 | Nickel |
| 2001/0035746 A1 | 11/2001 | Burstein et al. |
| 2004/0169198 A1* | 9/2004 | Nagata .............. H01L 23/49822 257/200 |
| 2007/0170587 A1 | 7/2007 | Honda |
| 2013/0087366 A1 | 4/2013 | Michael et al. |
| 2014/0070385 A1 | 3/2014 | Tan |
| 2015/0137260 A1 | 5/2015 | Matsui et al. |
| 2016/0118961 A1 | 4/2016 | Nagasato |

FOREIGN PATENT DOCUMENTS

| | | |
|---|---|---|
| JP | H8-330474 | 12/1996 |
| JP | 2002-353365 | 12/2002 |
| JP | 2007-201025 | 8/2007 |
| JP | 2016-086085 | 5/2016 |
| WO | 01/57608 A1 | 8/2001 |

OTHER PUBLICATIONS

European Patent Office, Supplementary European Search Report in EP Appln. No. 16846286 (dated Feb. 21, 2019).

* cited by examiner

SEMICONDUCTOR DEVICE INCLUDING EXTERNAL TERMINAL GROUPS

TECHNICAL FIELD

The present invention relates to a semiconductor device.

BACKGROUND ART

Conventionally, some surface mount type semiconductor devices adopt a grid array package, on which a large number of external terminals can be mounted into a high density.

An example of the conventional technology related to this is disclosed in Patent Document 1 listed below.

CITATION LIST

Patent Documents

Patent Document 1: Japanese Patent Application Publication No. 2007-201025

SUMMARY OF INVENTION

Technical Problem

However, in such conventional semiconductor devices, no sufficient consideration is given to a grid layout expected to deal with a large current, and thus electric current may concentrate in particular external terminals, to disadvantageously shorten the lives of the semiconductor devices.

In view of the above problem found by the inventors of the present invention, an object of the invention disclosed herein is to provide a semiconductor device in which current is prevented from easily concentrating in particular external terminals.

Solution to Problem

According to an aspect of the present invention, a semiconductor device disclosed herein includes a plurality of external terminals which are arranged in an array at a bottom surface of a package. Here, the plurality of external terminals include a first external terminal group for accepting an input of current from an outside of the device and a second external terminal group for outputting the current to the outside of the device. The first external terminal group and the second external terminal group are laid out such that arrangement patterns of the first external terminal group and the second terminal group engage with each other (first configuration).

In the semiconductor device having the first configuration described above, the arrangement patterns may each have a comb-like shape, a cross shape, an S shape, a T shape, an L shape, or a combination of these shapes (second configuration).

In the semiconductor device having the first or second configuration described above, the plurality of external terminals may be pins, solder balls, or electrode pads (third configuration).

The semiconductor device having any one of the first to third configurations described above may further have a switch element integrated between the first external terminal group and the second external terminal group (fourth configuration).

The semiconductor device having the fourth configuration described above may further have a wiring layer which electrically connects between each of the first external terminal group and the second external terminal group and the switch element (fifth configuration).

In the semiconductor device having the fifth configuration described above, the wiring layer may include a plurality of layers (a sixth configuration).

According to another aspect of the present invention, an electronic apparatus disclosed herein includes the semiconductor device having any one of the fourth to sixth configurations described above (seventh configuration).

In the electronic apparatus having the seventh configuration described above, the semiconductor device may function as a part of a power supply device which uses the switch element to generate a desired output voltage from a power supply voltage (eighth configuration).

Further, in the electronic apparatus having the seventh configuration described above, the semiconductor device may function as a part of a transmission device which uses the switch element to transmit a digital signal (ninth configuration).

Further, in the electronic apparatus having the seventh configuration described above, the semiconductor device may function as a part of a motor driving device which uses the switch element to drive a motor (tenth configuration).

Advantageous Effects of Invention

According to the invention disclosed herein, current is prevented from easily concentrating in a particular external terminal, and this makes it possible to provide a long-life semiconductor device.

DESCRIPTION OF EMBODIMENTS

Figure 1:
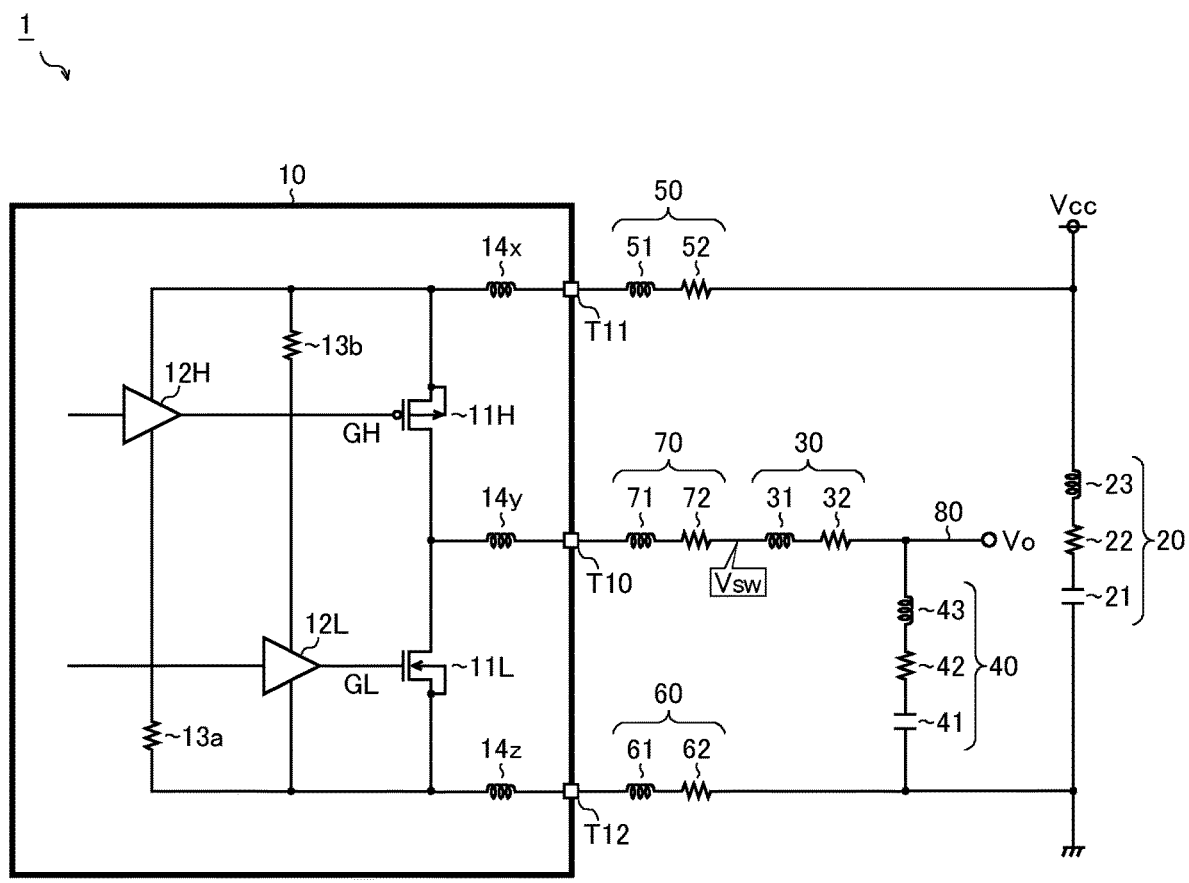
FIG. 1 is an application diagram showing an overall configuration of a switching power supply device.

Switching Power Supply Device: FIG. 1 is a circuit diagram showing an overall configuration of a switching power supply device. A switching power supply device 1 of the present configuration example has a semiconductor device 10 and various discrete components (a bypass capacitor 20, an output inductor 30, and an output capacitor 40) which are externally attached to the semiconductor device 10. The switching power supply device 1 uses a switching output stage (in the example shown in the figure, an output transistor 11H and a synchronous rectification transistor 11L which are integrated in the semiconductor device 10, and the output inductor 30 and the output capacitor 40 which are externally attached to the semiconductor device 10) to lower a power supply voltage Vcc, and thereby generates a desired output voltage Vo.

The semiconductor device 10 is an IC or an LSI which functions as a part of the switching power supply device 1, and includes the output transistor 11H and the synchronous rectification transistor 11L, and a high-side driver 12H and a low-side driver 12L. In the semiconductor device 10, a control circuit and an abnormality protection circuit, neither of which is illustrated, are also integrated.

Furthermore, the semiconductor device 10 has, as means for establishing electrical connection with an outside of the device, a plurality of external terminals (in the example shown in the figure, a switch terminal T10, a power supply terminal T11, and a ground terminal T12). The switch terminal T10 is an external terminal for external connection of a switch line 70. The power supply terminal T11 is an external terminal for external connection of a power supply line 50. The ground terminal T12 is an external terminal for external connection of a ground line 60.

The output transistor 11H is a P channel type metal oxide semiconductor field effect transistor (PMOSFET) which functions as a high-side switch of the switching output stage. A source and a backgate of the output transistor 11H are both internally connected to the power supply terminal T11. A drain of the output transistor 11H is internally connected to the switch terminal T10. A gate of the output transistor 11H is connected to a high-side gate signal GH application terminal (an output terminal of the high-side driver 12H). The output transistor 11H is turned off when the high-side gate signal GH is at high level, and is turned on when the high-side gate signal GH is at low level.

The synchronous rectification transistor 11L is an N channel type MOSFET (NMOSFET) which functions as a low-side switch of the switching output stage. A source and a backgate of the synchronous rectification transistor 11L are both internally connected to the ground terminal T12. A drain of the synchronous rectification transistor 11L is internally connected to the switch terminal T10. A gate of the synchronous rectification transistor 11L is connected to a low-side gate signal GL application terminal (an output terminal of the low-side driver 12L). The synchronous rectification transistor 11L is turned on when the low-side gate signal GH is at high level, and is turned on when the low-side gate signal GL is at low level.

In the switching output stage, the output transistor 11H and the synchronous rectification transistor 11L are turned on and off complementarily. By such on/off operation, at the switch terminal T10 (or the switch line 70), a switch voltage Vsw is generated which is a rectangular wave voltage and pulse-driven between the power supply voltage Vcc and a ground voltage GND. Note that, in this specification, the term "complementarily" covers not only a case where on/off of the output transistor 11H and on/off of the synchronous rectification transistor 11L are completely reversed but also a case where a simultaneous off period (dead time) is provided during which both of the transistors are simultaneously off.

Furthermore, in the switching output stage, the above-described synchronous rectification method is not meant as a limitation, and a diode rectification method may instead be adopted, by using a rectification diode instead of the synchronous rectification transistor 11L. Moreover, the switch element used in the switching output stage is not limited to a MOSFET, but may be a power element such as a GaN power device or the like.

The high-side driver 12H is connected between the power supply terminal T11 and the ground terminal T12, and generates the high-side gate signal GH in accordance with a high-side driver control signal fed from the unillustrated control circuit.

The low-side driver 12L is connected between the power supply terminal T11 and the ground terminal T12, and generates the low-side gate signal GL in accordance with a low-side driver control signal fed from the unillustrated control circuit.

Note that an inner conductor connecting between the high-side drive 12H and the ground terminal T12 and an inner conductor connecting between the low-side driver 12L and the power supply terminal T11 are accompanied by parasitic resistance components 13a and 13b, respectively. Note also that the power supply terminal T11, the switch terminal T10, and the ground terminal T12 are accompanied by parasitic inductance components 14x, 14y, and 14z, respectively.

The bypass capacitor 20 is means for inhibiting variation of power supply to the semiconductor device 10, and is connected between the power supply line 50 and the ground line 60. Note that the bypass capacitor 20 includes, in addition to a capacitance component 21, an equivalent series resistance component 22 and an equivalent series inductance component 23. As the bypass capacitor 20, it is desirable to use, for example, a multi-layer ceramic capacitor, which is small in size, which has a small equivalent series resistance component and a small equivalent series inductance component 23, and which is operable in a wide range of temperature.

The output inductor 30 and the output capacitor 40 form an LC filter, which rectifies and smooths the switch voltage Vsw to generate the output voltage Vo. A first terminal of the output inductor 30 is connected to the switch line 70. A second terminal of the output inductor 30 and a first terminal of the output capacitor 40 are both connected to an output line 80. A second terminal of the output capacitor 40 is connected to the ground line 60. Note that the output inductor 30 includes, in addition to an inductance component 31, an equivalent series resistance component 32. Note also that the output capacitor 40 includes, in addition to a capacitance component 41, an equivalent series resistance component 42 and an equivalent series inductance component 43.

The power supply line 50 is a printed conductor for electrical connection between a power supply voltage Vcc application terminal and the power supply terminal T11. The power supply line 50 is accompanied by a parasitic inductance component 51 and a parasitic resistance component 52.

The ground line 60 is a printed conductor for electrical connection between a ground terminal (a ground voltage GND application terminal) and the ground terminal T12. The ground line 60 is accompanied by a parasitic inductance component 61 and a parasitic resistance component 62.

The switch line 70 is a printed conductor for electrical connection between the first terminal of the output inductor 30 and the switch terminal T10. The switch line 70 is accompanied by the parasitic inductance component 61 and the parasitic resistance component 62.

The output line 80 is a printed conductor for electrical connection between each of the second terminal of the output inductor 30 and the first terminal of the output capacitor 40 and an output voltage Vo output terminal. Like other printed conductors, the output line 80 is also accompanied by a parasitic inductance component and a parasitic resistance component. However, for convenience of illustration, the parasitic inductance and resistance components are not shown.

Figure 2:
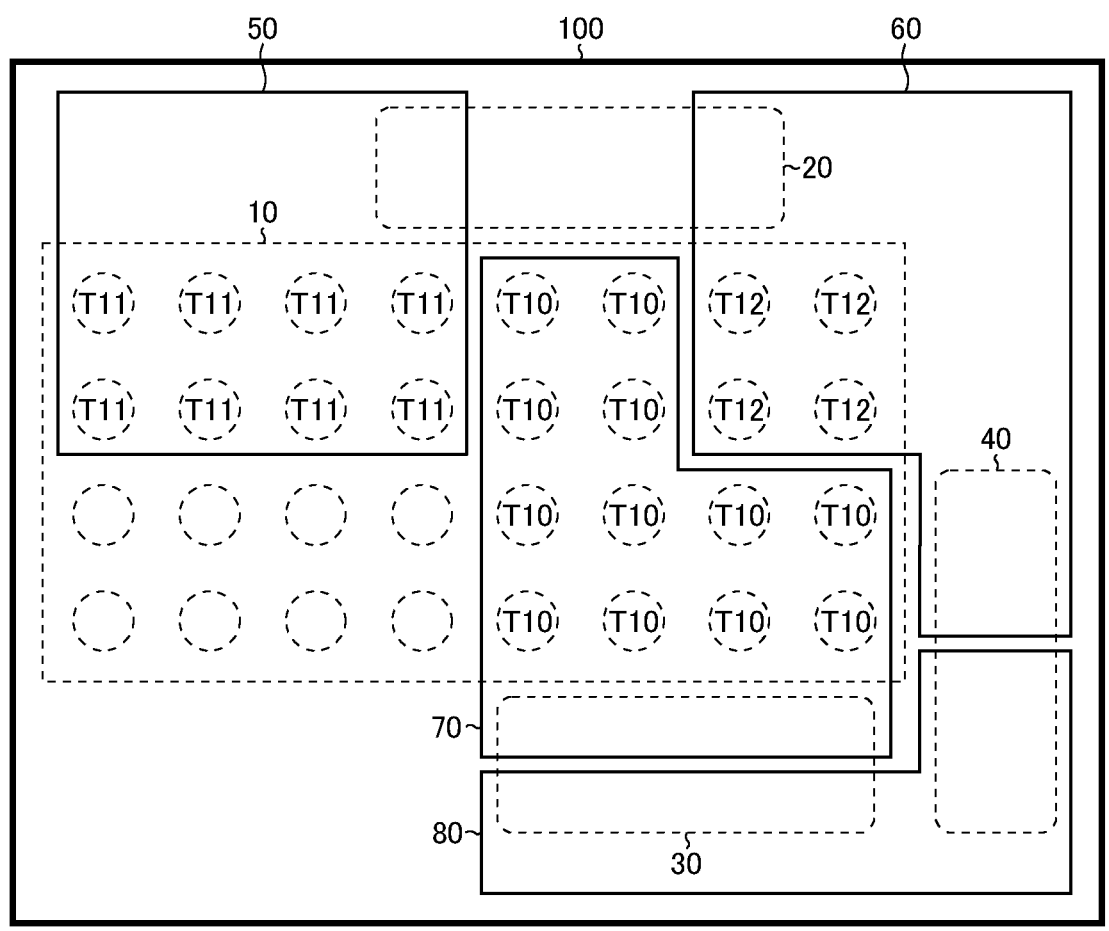
FIG. 2 is a see-through top view showing a first embodiment of a grid layout.

Grid Layout (First Embodiment): FIG. 2 is a see-through top view showing a first embodiment of a grid layout at the bottom surface of the package of the semiconductor device 10. In the figure, the power supply line 50, the ground line 60, the switch line 70, and the output line 80, which are patterned on a printed wiring board 100, are each illustrated in solid line. On the other hand, the semiconductor device 10, the bypass capacitor 20, the output inductor 30, and the output capacitor 40 are each illustrated in short-dash line in a see-through manner.

As shown in the figure, the semiconductor device 10 adopts a grid array package, where a plurality of external terminals are arranged in an array at the bottom surface of the package. In particular, the switch terminal T10, the power supply terminal T11, and the ground terminal T12, through each of which a large current flows along with turning on/off of the output transistor 11H and the synchronous rectification transistor 11L, respectively comprise a plurality of switch terminals T10, a plurality of power supply terminals T11, and a plurality of ground terminals T12 (in the example shown in the figure, twelve switch terminals T10, eight power supply terminals T11, and four ground terminals T12), which are respectively commonly connected within the semiconductor device 10.

Thus, by parallelly arranging a plurality of external terminals, through each of which a large current flows, to form external terminal groups, it is possible to make current flow in a plurality of current paths, in contrast to a configuration where a large current flows through a single external terminal, and this makes it possible to alleviate current concentration in an external terminal or in a wiring layer electrically connected thereto.

Note that the larger the number of external terminals included in an external terminal group is, the larger the number of current paths becomes, and thus an enhanced current distribution effect can be achieved. However, in a case where only insufficient consideration has been given to the grid layout, it may be impossible to achieve a current distribution effect that should be achieved corresponding to the number of external terminals.

Figure 3:
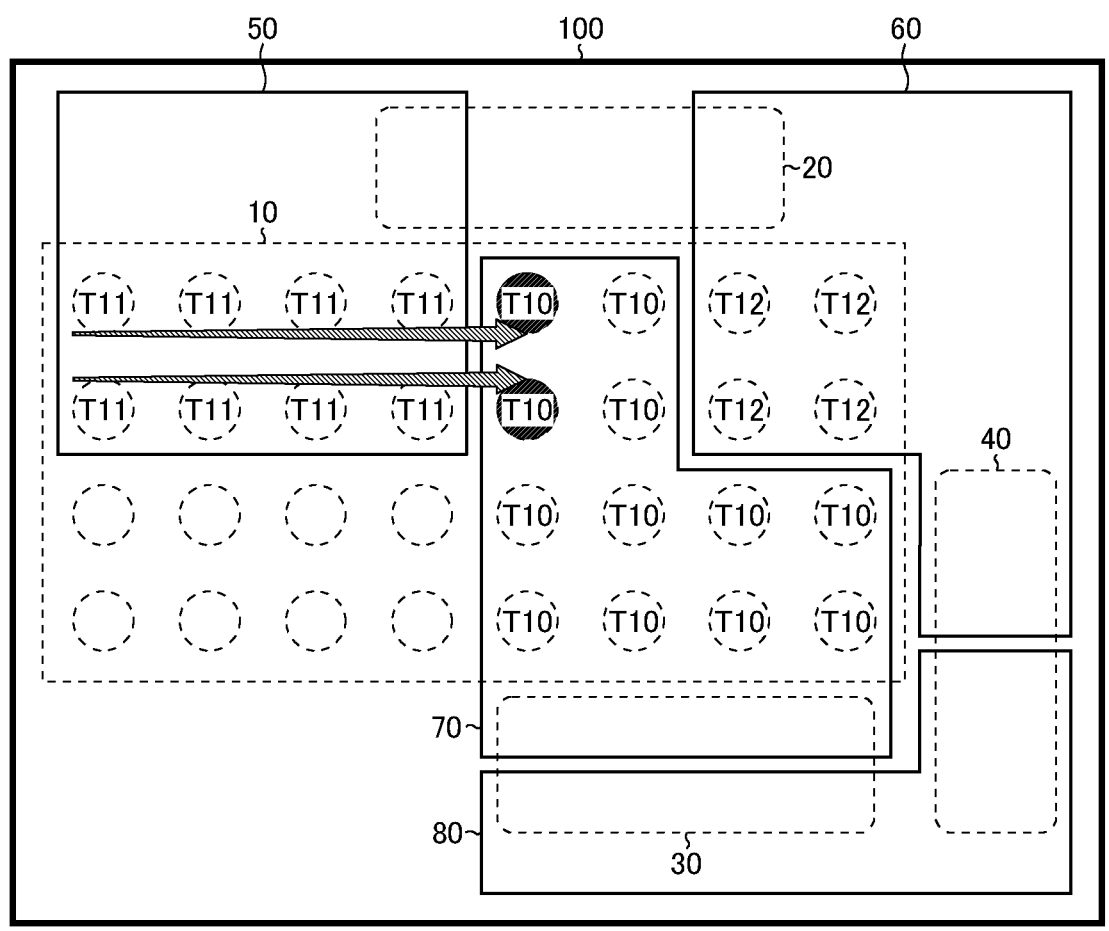
FIG. 3 is a see-through top view showing behavior observed at the time of current concentration.

FIG. 3 is a see-through top view of the semiconductor device 10 showing behavior observed at the time of current concentration. The figure shows that current flowing from the power supply line 50 into the switch line 70 concentrates in part of the switch terminals T10 (specifically, the two switch terminals T10 that are hatched).

Note that, when the output transistor 11H is on, the plurality of power supply terminals T11 function as a first external terminal group for accepting an input of current from the outside of the device. On the other hand, when the synchronous rectification transistor 11L is on, it is the plurality of ground terminals T12 that function as the first external terminal group. Furthermore, both when the output transistor 11H is on and when the synchronous rectification transistor 11L is on, the plurality of switch terminals T10 function as a second external terminal group for outputting current to the outside of the device.

In the grid layout of the figure, the power supply terminals T11 are arranged in a rectangular (two rows×four columns) arrangement pattern to occupy one corner of the bottom surface of the package. The ground terminals T12 are arranged in a square (two rows×two columns) arrangement pattern to occupy another corner of the bottom surface of the package. On the other hand, the switch terminals T10 are arranged in an L-shape arrangement pattern to be sandwiched between the power supply terminals T11 and the ground terminals T12.

However, it is only two (the two switch terminals T10 illustrated with hatching) of the twelve switch terminals T10 that are located adjacent to the power supply terminals T11. As a result, for example, a current flowing from the power supply terminals T11 via the output transistor 11H (not shown in the figure) to reach the switch terminals T10 flows not in a manner uniformly distributed to all of the twelve switch terminals T10 but in a manner concentrating in the two switch terminals T10 mentioned above (see the hatched arrows in the figure).

That is, the ten switch terminals T10, which are not located adjacent to the power supply terminals T11 each do not fully execute the current distribution effect that they are expected to execute, and the situation is not much different from the situation in a case where only two power supply terminals T10 are provided with respect to eight power supply terminals T11.

Note that the relation between the ground terminals T12 and the switch terminals T10 is the same as the relation described above, such that, of the twelve switch terminals T10, those other than four switch terminals T10 located adjacent to the ground terminals T12 each do not fully execute the current distribution effect that they are expected to execute.

Figure 4:
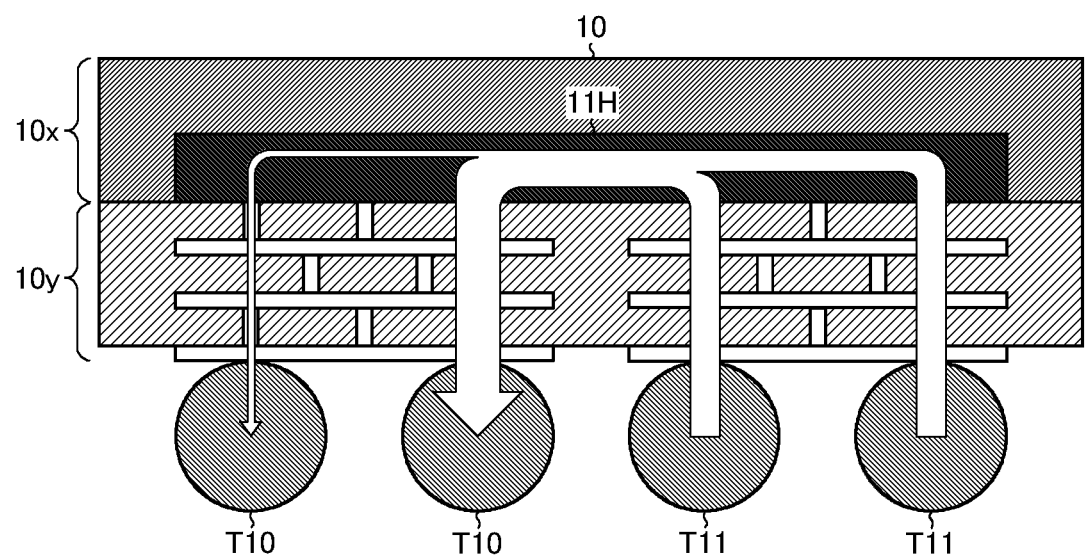
FIG. 4 is a vertical sectional view showing the behavior observed at the time of current concentration.

FIG. 4 is a vertical sectional view of the semiconductor device 10, conceptually illustrating behavior observed at the time of current concentration. The white arrow in the figure indicates current which flows from the power supply terminals T11 via the output transistor 11H into the switch terminals T10, and the thickness of the arrow indicates how large the current is.

As shown in the figure, the semiconductor device 10 has a semiconductor substrate 10x in which the output transistor 11H is integrated, and a wiring layer 10y which comprises a plurality of layers and is disposed on the semiconductor substrate 10x. The wiring layer 10y establishes electrical connection between the power supply terminals T11 and the output transistor 11H, and between the switch terminals T10 and the output transistor 11H. Note that electrical connection between the layers of the wiring layer 10y is established through interlayer vias.

Although not clearly shown in the figure, a wiring layer similar to the one described above is also formed between the ground terminals T12 and the synchronous rectification transistor 11L, and between the switch terminals T10 and the synchronous rectification transistor 11L.

Here, with a current flowing from the plurality of power supply terminals T11 to a particular one of the switch terminals T10 (in the example shown in the figure, the second one from the left) in a concentrated manner, it is natural that the distribution of current in the wiring layer 10y also becomes uneven. Under such a condition, the situation is not that a uniform load is applied all over the wiring layer 10y, but that a local load is applied to the part in which the current is concentrated. This causes the part to deteriorate faster than the other parts, and thus may disadvantageously shorten the product life of the semiconductor device 10.

Figure 5:
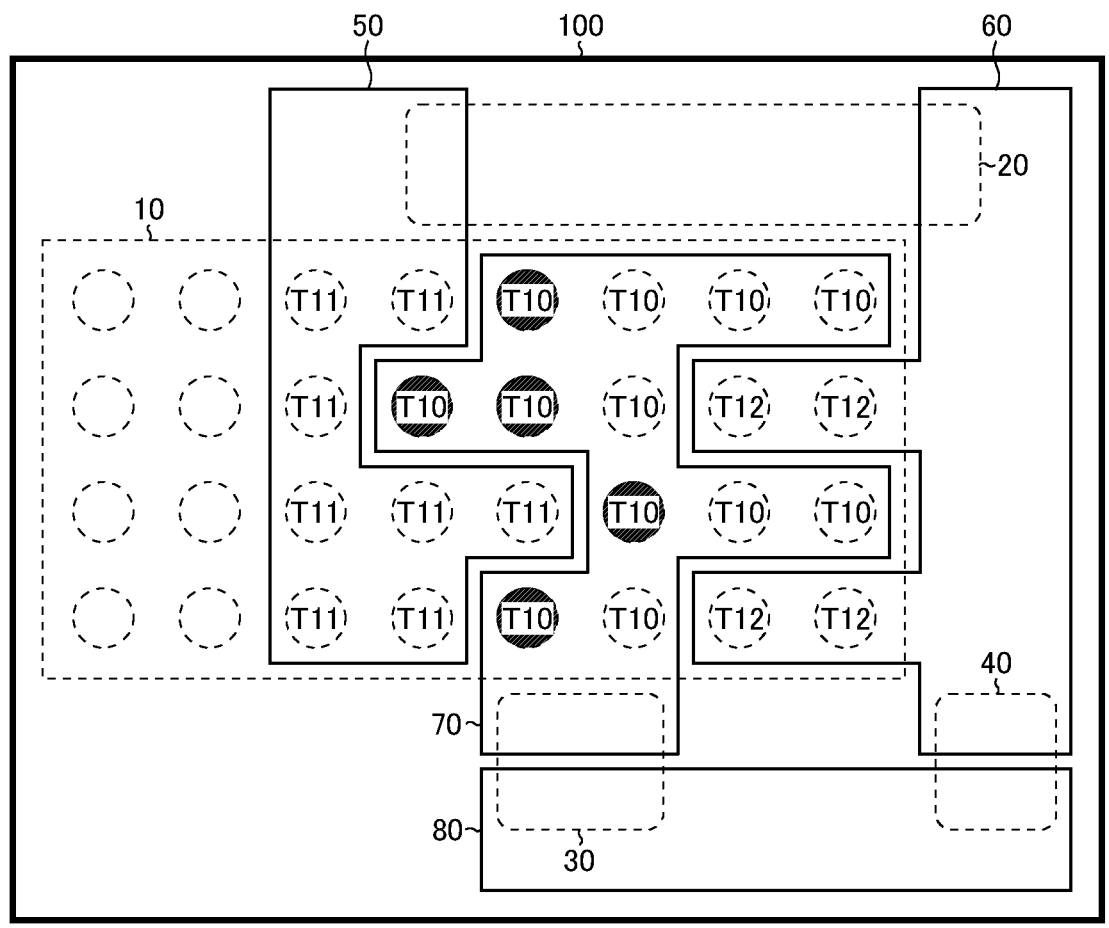
FIG. 5 is a see-through top view showing a second embodiment of the grid layout.

Grid Layout (Second Embodiment): FIG. 5 is a see-through top view showing a second embodiment of the grid layout at the bottom surface of the package of the semiconductor device 10. In the figure, the power supply line 50, the ground line 60, the switch line 70, and the output line 80, which are patterned on the printed wiring board 100, are each illustrated in solid line. On the other hand, the semiconductor device 10, the bypass capacitor 20, the output inductor 30, and the output capacitor 40 are each illustrated in short-dash line in a see-through manner.

As shown in the figure, in the grid layout of the second embodiment, the first external terminal group (the power supply terminals 11 and the ground terminals T12) for accepting an input of current from the outside of the device and the second external terminal group (the switch terminals T10) for outputting current to the outside of the device are laid out into arrangement patterns that engage with each other.

More specifically, the first external terminal group and the second external terminal group are both arranged in comb-like arrangement patterns at the bottom surface of the package such that a projected part of one of the arrangement patterns engages in a recessed part of the other of the arrangement patterns.

By adopting such a grid layout, five switch terminals T10 that are hatched are located adjacent to the power supply terminals T11. Accordingly, the current flows in a manner distributed in more switch terminals T10 than in the first embodiment (FIG. 3) discussed above.

Note that the relation between the ground terminals T12 and the switch terminals T10 is similar to the relation described above, and it becomes possible to further enhance the current distribution effect than in the first embodiment (FIG. 3) discussed above.

Figure 6:
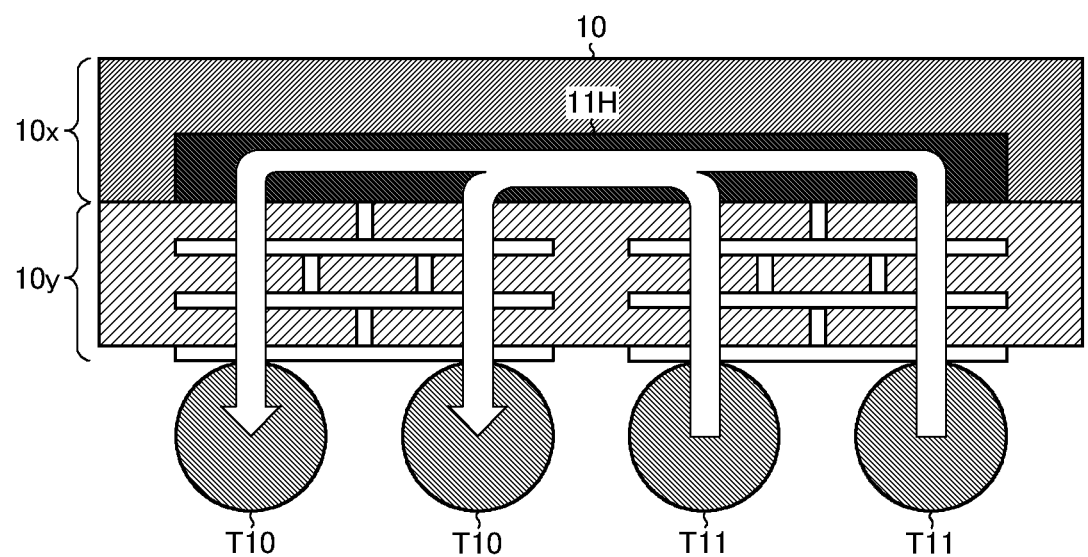
FIG. 6 is a vertical sectional view showing behavior observed when current concentration is eliminated.
Figure 7:
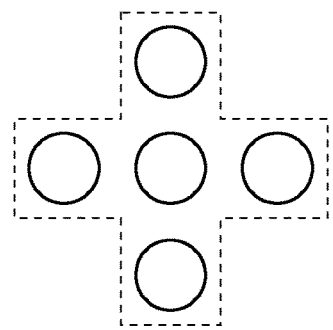
FIG. 7 is a diagram showing a variation (a cross shape) of an arrangement pattern.
Figure 8:
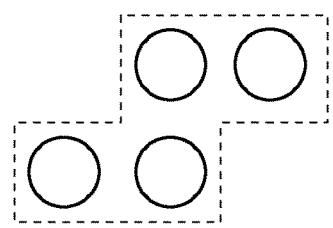
FIG. 8 is a diagram showing a variation (an S-shape) of the arrangement pattern.
Figure 9:
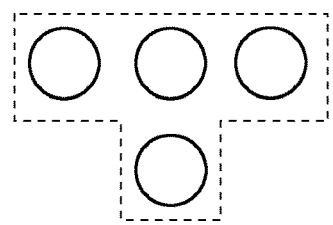
FIG. 9 is a diagram showing a variation (a T-shape) of the arrangement pattern.
Figure 10:
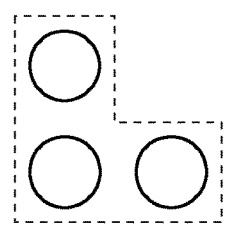
FIG. 10 is a diagram showing a variation (an L-shape) of the arrangement pattern.

FIG. 6 is a vertical sectional view of the semiconductor device 10, conceptually illustrating behavior observed when current concentration is eliminated. The white arrow in the figure indicates current which flows from the power supply terminals T11 via the output transistor 11H into the switch terminals T10, and the thickness of the arrow indicates how large the current is.

As shown in the figure, in a condition where current flows from the light source terminals T11 to the switch terminals T10 in a uniformly distributed manner, the distribution of current in the wiring layer 10y also becomes uniform. As a result, a uniform load is applied all over the wiring layer 10y, and this makes it difficult for local deterioration of the wiring layer 10y to occur, and thus helps prolong the product life of the semiconductor device 10.

Arrangement Pattern: FIG. 7 to FIG. 10 are diagrams showing variations of the arrangement pattern. The arrangement pattern of an external terminal group is not limited to the comb-like shape shown in FIG. 5 referred to above; for example, a cross shape shown in FIG. 7, an S shape shown in FIG. 8, a T shape shown in FIG. 9, an L shape shown in FIG. 10, or a combination of these shapes may be adopted.

Here, as for the arrangement patterns of external terminal groups mentioned above as examples, for the maximum effect of uniformizing current distribution, it is desirable to select the optimum arrangement pattern or make the optimum combination such that the ratio of external terminals adjacent to each other (for example, T10:T11 or T10:T12) is as close to 1:1 as possible.

Figure 11:
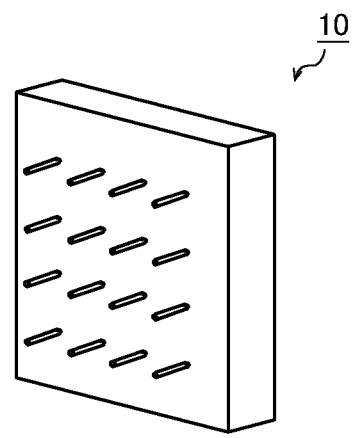
FIG. 11 is a diagram showing a variation (PGA) of an IC package.
Figure 12:
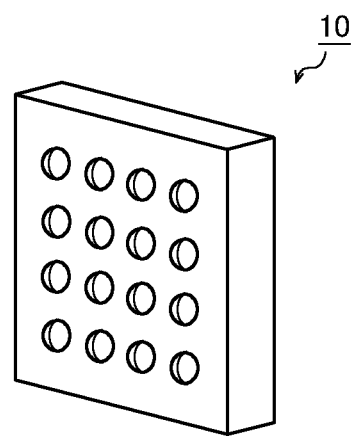
FIG. 12 is a diagram showing a variation (BGA) of the IC package.
Figure 13:
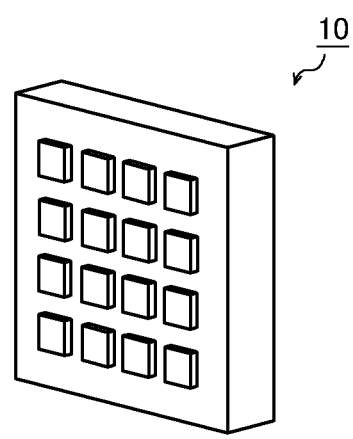
FIG. 13 is a diagram showing a variation (LGA) of the IC package.

IC Package: FIG. 11 to FIG. 13 are diagrams showing variations of an IC package.

FIG. 11 illustrates a pin grid array (PGA) package. In a case where the semiconductor device 10 is a PGA-package type semiconductor device, the external terminals (the switch terminals T10, the power supply terminals T11, and the ground terminals T12, etc.) are formed as pins, which are arranged in an array at the bottom surface of the package.

FIG. 12 illustrates a ball grid array (BGA) package. In a case where the semiconductor device 10 is a BGA-package type semiconductor device, the external terminals (the switch terminals T10, the power supply terminals T11, and the ground terminals T12, etc.) are formed as solder balls, which are arranged in an array at the bottom surface of the package.

FIG. 13 illustrates a land grid array (LGA) package. In a case where the semiconductor device 10 is an LGA-package type semiconductor device, the external terminals (the switch terminals T10, the power supply terminals T11, and the ground terminals T12, etc.) are formed as electrode pads, which are arranged in an array at the bottom surface of the package.

Figure 14:
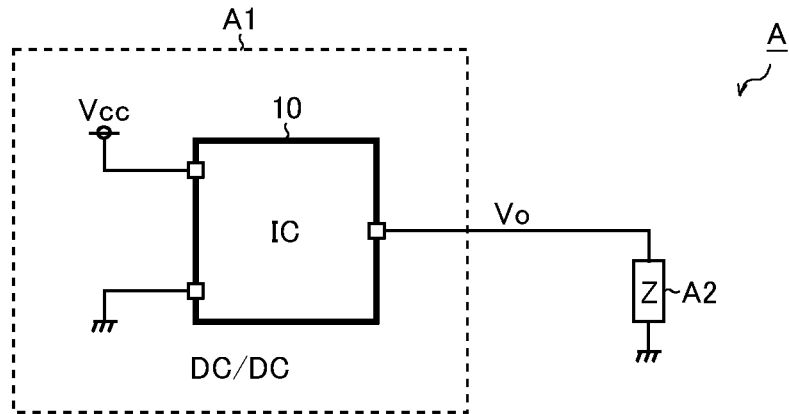
FIG. 14 is a diagram showing a variation (a switching power supply device) of an electronic apparatus.
Figure 15:
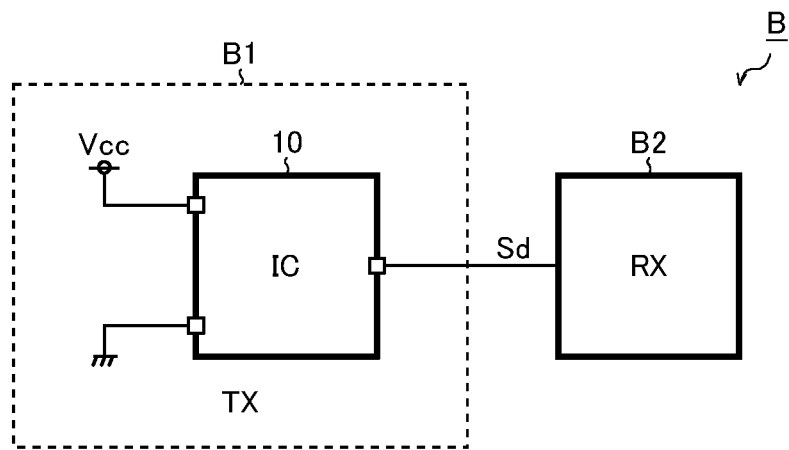
FIG. 15 is a diagram showing a variation (a transmission device) of the electronic apparatus.
Figure 16:
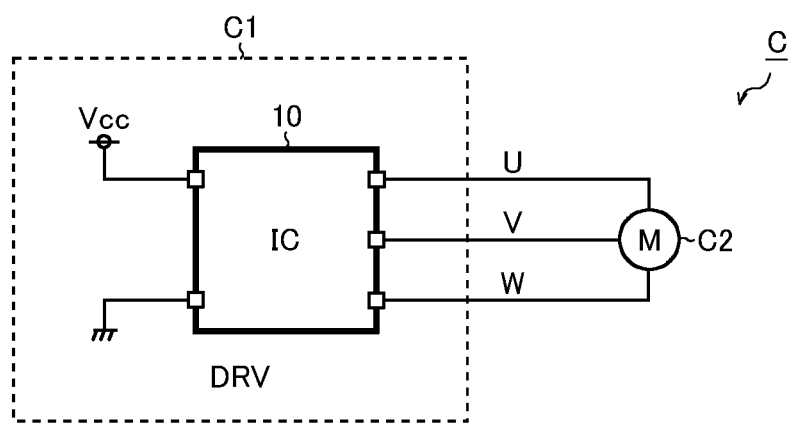
FIG. 16 is a diagram showing a variation (a motor driving device) of the electronic apparatus.

Examples of Application to Electronic Apparatuses: FIG. 14 to FIG. 16 are diagrams showing variations of an electronic apparatus having the semiconductor device 10.

An electronic apparatus A illustrated in FIG. 14 has a switching power supply device A1 which uses the switching output stage integrated in, or externally connected to, the semiconductor device 10 to generate a desired output voltage Vo from the power supply voltage Vcc, and a load A2 which operates by receiving supply of the output voltage Vo. The semiconductor device 10 functions as a part of the switching power supply device A1. Thus, it can be said that, as an application example, the electronic apparatus A is as preferable as the embodiments described above.

An electronic apparatus B illustrated in FIG. 15 has a transmission device B1 which uses the switching output stage integrated in, or externally connected to, the semiconductor device 10 to transmit a digital signal Sd, and a receiver device B2 which receives the digital signal Sd. The semiconductor device 10 functions as a part of the transmission device B1.

An electronic apparatus C illustrated in FIG. 16 has a motor driving device C1 which uses the switching output stage integrated in, or externally connected to, the semiconductor device 10 to generate motor driving signals U, V, and W, and a motor C2 which rotates by receiving supply of the motor driving signals U, V, and W. The semiconductor device 10 functions as a part of the motor driving device C1.

Thus, the semiconductor device 10 finds its application in various apparatuses.

Figure 17:
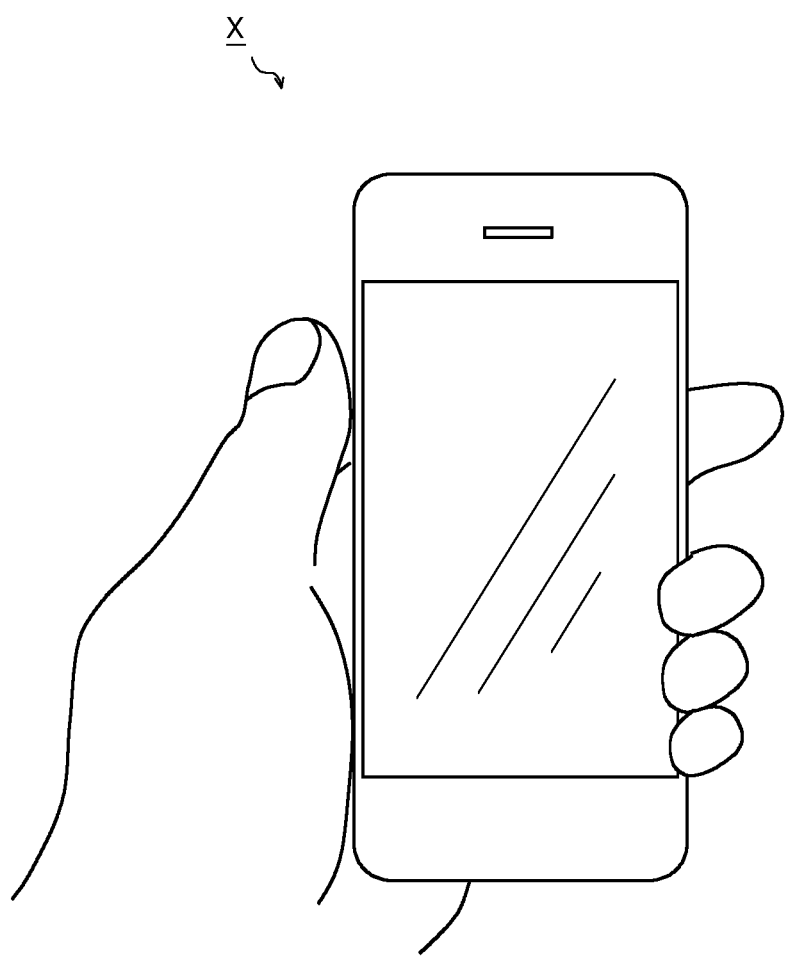
FIG. 17 is an external view of a smart phone.

FIG. 17 is an external view of a smart phone. A smart phone X is an example of the electronic apparatus A shown in FIG. 14, and the switching power supply device A1 using the semiconductor device 10 can be preferably mounted in the smart phone X.

Other Modified Examples: In addition to the above embodiments, it is possible to add various modifications to the various technical features disclosed herein without departing the spirit of the technological creation. In other words, it should be understood that the above embodiments are examples in all respects and are not limiting; the technological scope of the present invention is not indicated by the above description of the embodiments but by the claims; and all modifications within the scope of the claims and the meaning equivalent to the claims are covered.

INDUSTRIAL APPLICABILITY

The invention disclosed herein is preferably usable, for example, as a technique to prolong the life of a low-voltage driven semiconductor device that deals with a large current.

LIST OF REFERENCE SIGNS 1 switching power supply device
10 semiconductor device
10x semiconductor substrate
10y wiring layer
11H output transistor (high-side switch of switching output stage)
11L synchronous rectification transistor (low-side switch of switching output stage)
12H high-side driver
12L low-side driver
13a, 13b parasitic resistance component
14x, 14y, 14z parasitic inductance component
20 bypass capacitor
21 capacitance component
22 equivalent series resistance component
23 equivalent series inductance component
30 output inductor
31 inductance component
32 equivalent series resistance component
40 output capacitor
41 capacitance component
42 equivalent series resistance component
43 equivalent series inductance component
50 power supply line
60 ground line
70 switch line
51, 61, 71 parasitic inductance component
52, 62, 72 parasitic resistance component
80 output line
100 printed wiring board
T10 switch terminal
T11 power supply terminal
T12 ground terminal
A, B, C electronic apparatus
A1 switching power supply device
A2 load
B1 transmission device
B2 receiver device
C1 motor driving device
C2 motor
X smart phone

The invention claimed is:
1. An electronic apparatus comprising:
a semiconductor device, and
a bypass capacitor,
wherein the semiconductor device comprises:
an upper-side transistor,
a lower-side transistor, and
a plurality of external terminals arranged in a matrix at a bottom surface of a package,
wherein the plurality of external terminals include:
a first external terminal group connected to a first node of the upper-side transistor,
a second external terminal group connected to a second node of the upper-side transistor and a first node of the lower-side transistor,
a third external terminal group connected to a second node of the lower-side transistor, and
a fourth external terminal which does not belong to the first external terminal group, the second external terminal group or the third external terminal group, and
wherein the first external terminal group, the second external terminal group and the third external terminal group are laid out such that an arrangement pattern of the second external terminal group engages with at least one of an arrangement pattern of the first external terminal group or an arrangement pattern of the third external terminal group,
wherein the first external terminal group is connected to a power supply line which is outside the semiconductor device, and the third external terminal group is connected to a ground line which is outside the semiconductor device,
wherein the bypass capacitor is connected between the power supply line and the ground line outside the semiconductor device, and
wherein the fourth terminal is disposed neither between the first external terminal group and the bypass capacitor, nor between the third external terminal group and the bypass capacitor.

2. The electronic apparatus according to claim 1, wherein the arrangement patterns each have a comb-like shape, a cross shape, an S shape, a T shape, an L shape, or a combination of these shapes.

3. The electronic apparatus according to claim 1, wherein the plurality of external terminals are pins, solder balls, or electrode pads.

4. The electronic apparatus according to claim 1, the semiconductor device further comprising
a wiring layer which electrically connects between each of the first external terminal group and the second external terminal group and the upper-side transistor.

5. The electronic apparatus according to claim 4, wherein the wiring layer includes a plurality of layers.

6. The electronic apparatus according to claim 1, wherein the semiconductor device functions as a part of a power supply device which uses the upper-side transistor and the lower-side transistor to generate a desired output voltage from a power supply voltage.

7. The electronic apparatus according to claim 1, wherein the semiconductor device functions as a part of a transmission device which uses the upper-side transistor and the lower-side transistor to transmit a digital signal.

8. The electronic apparatus according to claim 1, wherein the semiconductor device functions as a part of a motor driving device which uses the upper-side transistor and the lower-side transistor to drive a motor.

9. The electronic apparatus according to claim 1, wherein the arrangement pattern of the second external terminal group engages with both of the arrangement pattern of the first external terminal group and the arrangement pattern of the third external terminal group.

10. The electronic apparatus according to claim 1, wherein external terminals included in each of the first external terminal group, the second external terminal group and the third external terminal group are collectively arranged longitudinally or laterally adjacent to each other as a continuous block in plan view of the bottom surface of the package.

* * * * *